(12) United States Patent
Balasubramanyam et al.

(10) Patent No.: US 6,884,672 B1
(45) Date of Patent: Apr. 26, 2005

(54) METHOD FOR FORMING AN ELECTRONIC DEVICE

(75) Inventors: Karanam Balasubramanyam, Hopewell Junction, NY (US); Serge Biesemans, Leuven (BE); Byeongju Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/701,191

(22) Filed: Nov. 4, 2003

(51) Int. Cl.[7] ............... H01L 21/8238; H01L 21/336
(52) U.S. Cl. .................. 438/231; 438/232; 438/305
(58) Field of Search ................. 438/231, 232, 438/233, 585, 592, 305, 226, 163, 199

(56) References Cited

U.S. PATENT DOCUMENTS

| | | | |
|---|---|---|---|
| 5,482,895 A | * | 1/1996 | Hayashi et al. ............ 438/620 |
| 5,539,229 A | * | 7/1996 | Noble et al. ............... 257/301 |
| 5,563,093 A | * | 10/1996 | Koda et al. ................ 438/231 |
| 5,576,244 A | * | 11/1996 | Hayashi et al. ............ 438/301 |
| 5,661,051 A | | 8/1997 | Yeh et al. |
| 5,767,004 A | * | 6/1998 | Balasubramanian et al. ........................ 438/592 |
| 5,773,348 A | | 6/1998 | Wu |
| 5,882,965 A | | 3/1999 | Schwalke et al. |
| 6,023,093 A | * | 2/2000 | Gregor et al. .............. 257/632 |
| 6,049,113 A | | 4/2000 | Shida |
| 6,057,555 A | * | 5/2000 | Reedy et al. ................. 257/9 |
| 6,069,054 A | * | 5/2000 | Choi ......................... 438/423 |
| 6,087,231 A | * | 7/2000 | Xiang et al. ............... 438/287 |
| 6,090,648 A | * | 7/2000 | Reedy et al. ............... 438/155 |
| 6,096,614 A | | 8/2000 | Wu |
| 6,117,717 A | | 9/2000 | Carbone et al. |
| 6,159,810 A | | 12/2000 | Yang |
| 6,162,716 A | * | 12/2000 | Yu et al. .................... 438/592 |
| 6,200,835 B1 | * | 3/2001 | Manning .................... 438/158 |
| 6,228,722 B1 | * | 5/2001 | Lu ............................. 438/279 |
| 6,294,442 B1 | | 9/2001 | Kamal |
| 6,297,173 B1 | * | 10/2001 | Tobin et al. ................ 438/778 |
| 6,303,493 B1 | * | 10/2001 | Lee ............................ 438/652 |
| 6,323,094 B1 | | 11/2001 | Wu |
| 6,391,732 B1 | * | 5/2002 | Gupta et al. ............... 438/305 |
| 6,432,763 B1 | * | 8/2002 | Yu ............................. 438/217 |
| 6,437,381 B1 | * | 8/2002 | Gruening et al. .......... 257/296 |
| 6,482,722 B2 | | 11/2002 | Kunii et al. |
| 6,521,502 B1 | * | 2/2003 | Yu ............................. 438/305 |
| 6,620,671 B1 | * | 9/2003 | Wang et al. ............... 438/226 |
| 6,635,946 B2 | * | 10/2003 | Lai et al. ................... 257/510 |
| 6,646,307 B1 | * | 11/2003 | Yu et al. .................... 257/347 |
| 6,661,044 B2 | * | 12/2003 | Jang ........................... 257/288 |
| 6,664,143 B2 | * | 12/2003 | Zhang ........................ 438/138 |
| 6,670,224 B2 | * | 12/2003 | Lee et al. ................... 438/160 |

(Continued)

FOREIGN PATENT DOCUMENTS

| | | |
|---|---|---|
| EP | 0989604 A2 | 3/2000 |
| JP | 8274185 A | 10/1996 |
| JP | 9017998 A | 1/1997 |
| JP | 2000114396 A | 4/2000 |

*Primary Examiner*—John F. Niebling
*Assistant Examiner*—Walter L. Lindsay, Jr.
(74) *Attorney, Agent, or Firm*—Ronald A. Kaschak; Hoffman, Warnick & D'Alessandro LLC

(57) ABSTRACT

Under the present invention, a layer of amorphous silicon is formed over a layer of gate dielectric. Over the layer of amorphous silicon, a gate cap dielectric is formed. The layer of amorphous silicon is then confined by at least one spacer, which is deposited under a low temperature process. Once the at least one spacer is in place, the amorphous silicon is exposed to a temperature sufficiently high to convert the amorphous silicon to polysilicon. By waiting until the amorphous silicon is confined within the at least one spacer before converting it to polysilicon, the variation in gate length is reduced.

20 Claims, 4 Drawing Sheets

U.S. PATENT DOCUMENTS

| | | | |
|---|---|---|---|
| 6,709,907 B1 * | 3/2004 | Yamazaki et al. | 438/163 |
| 6,730,572 B2 * | 5/2004 | Lee et al. | 438/373 |
| 6,753,216 B2 * | 6/2004 | Mathew et al. | 438/199 |
| 6,770,944 B2 * | 8/2004 | Nishinohara et al. | 257/402 |
| 6,780,705 B2 * | 8/2004 | Yasuda | 438/239 |
| 6,794,277 B2 * | 9/2004 | Machida et al. | 438/535 |
| 6,803,315 B2 * | 10/2004 | Dokumaci et al. | 438/692 |
| 2002/0086503 A1 | 7/2002 | Schuegraf et al. | |

\* cited by examiner

US 6,884,672 B1

METHOD FOR FORMING AN ELECTRONIC DEVICE

BACKGROUND OF THE INVENTION

1. Field of the Invention

The present invention generally relates to a method for forming an electronic device such as a field-effect transistor (FET) device. Specifically, the present invention relates to a method for forming an electronic device in which gate length variation is reduced.

2. Related Art

In the process of manufacturing electronic devices such as FET devices, several factors can lead to gate length variation. One such factor is the incapability of the lithographic tools to produce straight edge gate lines. Another factor is the etching process whereby uneven gate lines are produced. However, a prevailing cause of gate length variation is the grain structure of polycrystalline silicon. Specifically, in the manufacture of many electronic devices such as FET devices, the gate polysilicon is deposited as polycrystalline silicon. The grain-like structure of the polysilicon typically causes gate line roughness during polysilicon etching. In addition, during high temperature processing of the device such as during rapid thermal anneal (RTA) gate sidewall oxidation, the gate polysilicon line roughness is increased as the polysilicon material undergoes further changes in crystal structure in an unconfined environment.

This gate line problem is partly alleviated through the use of amorphous silicon for the gate silicon. Specifically, through the use of amorphous silicon, the increase in the roughness of the gate line is minimized during the gate silicon etch. However, in the conventional use of the amorphous silicon, high temperature processing such as the RTA gate sidewall oxidation and/or high temperature low pressure (LP) chemical vapor deposition (LPCVD) of nitride immediately follows. Exposure of the amorphous silicon to high temperatures causes structural transformation, which when occurring in an unconfined environment, cause movement of the silicon material during the polysilicon grain growth. Thus, the roughness of the gate silicon line is increased, which leads to variation in the gate length. Referring to FIG. 1, a scanning electron micrograph (SEM) image 10 of a polysilicon gate line 12 as produced under the prior art is depicted. As shown, the surface of the polysilicon gate line 12 is rough, which causes variation in the gate length 14. For example, at point 16 gate length 14 is approximately 115 nm. Conversely, at point 18, gate length 14 is approximately 128 nm. Such a variation in gate length 14 can raise significant performance issues in the device.

In view of the foregoing, there exists a need for a method for manufacturing an electronic device. Specifically, a need exists for a method of manufacturing an electronic device in which gate length variation is reduced. A further need exists for a method of manufacturing an electronic device in which amorphous silicon is used as the gate silicon. However, another need exists for the amorphous silicon to be exposed to high temperatures for transformation to polysilicon only in a confined environment.

SUMMARY OF THE INVENTION

In general, the present invention provides a method for forming an electronic device such as a FET device. Specifically, under the present invention, a layer of amorphous silicon is formed over a layer of gate dielectric. After the layer of amorphous silicon is formed, a gate cap dielectric is deposited. Implantation of dopants is then performed as needed. Thereafter, gate lines are patterned lithographically and the gate cap dielectric, amorphous silicon, and gate dielectric are etched to form the gate lines. It should be noted that the state of silicon is amorphous at the time of etching to minimize the line edge roughness. The absence of grain boundaries, which would be present in polysilicon, reduces the line edge roughness at the time of etching. Further, the amorphous silicon is confined on the top by gate cap dielectric and on the bottom by gate dielectric. The sides of amorphous silicon are then confined by at least one spacer, which is deposited under a low temperature process. Low temperature processing in this manner preserves the chrystallographical state of the amorphous silicon material throughout the spacer deposition(s). Once the at least one spacer is in place, the amorphous silicon is exposed to a temperature sufficiently high to convert the amorphous silicon to polysilicon. By waiting until the amorphous silicon is confined within the at least one spacer before converting it to polysilicon, the movement of the silicon atoms within the silicon material is confined within the at least one spacer laterally and the variation in gate length is reduced.

A first aspect of the present invention provides a method for forming an electronic device, comprising: providing a layer of gate dielectric; forming a layer of amorphous silicon on the layer of gate dielectric; forming a gate cap dielectric on the layer of amorphous silicon; providing at least one spacer adjacent the layer of amorphous silicon; and exposing the amorphous silicon to a temperature sufficiently high to convert the amorphous silicon to polysilicon after the at least one spacer has been provided.

A second aspect of the present invention provides a method for forming an electronic device, comprising: providing a layer of gate dielectric; forming a layer of amorphous silicon on the layer of gate dielectric; forming a gate cap dielectric on the layer of amorphous silicon; providing at least one spacer adjacent the layer of amorphous silicon; and performing a rapid thermal anneal at a temperature of at least approximately 750° C. after the at least one spacer has been provided to convert the amorphous silicon to polysilicon.

A third aspect of the present invention provides a method for forming a field-effect transistor (FET) device, comprising: providing a layer of gate dielectric; forming a layer of amorphous silicon on the layer of gate dielectric; forming a gate cap dielectric on the layer of amorphous silicon; providing a first spacer adjacent the layer of amorphous silicon; providing a second spacer adjacent the layer of amorphous silicon; and exposing the amorphous silicon to a temperature of at least approximately 750° C. after the second spacer has been provided to convert the amorphous silicon to polysilicon.

Therefore, the present invention provides a method for forming an electronic device.

BRIEF DESCRIPTION OF THE DRAWINGS

These and other features of this invention will be more readily understood from the following detailed description of the various aspects of the invention taken in conjunction with the accompanying drawings in which.

Figure 1:
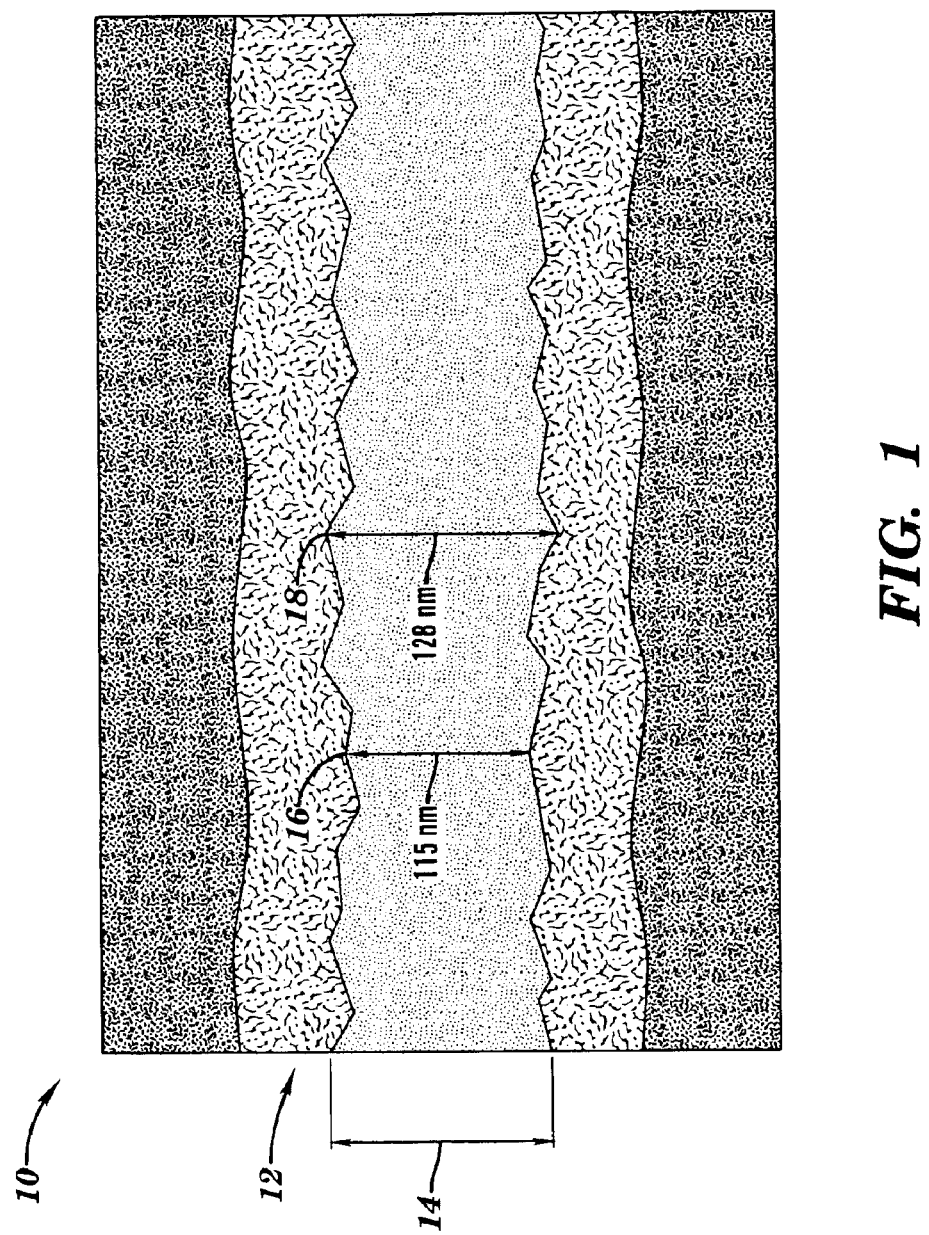
FIG. 1 depicts an illustration of an SEM image of a polysilicon gate line as produced according to the prior art.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above, the present invention provides a method for forming an electronic device such as a FET device. Specifically, under the present invention, a layer of amorphous silicon is formed over a layer of gate dielectric. After the layer of amorphous silicon is formed, a gate cap dielectric is deposited. Implantation of dopants is then performed as needed. Thereafter, gate lines are patterned lithographically and the gate cap dielectric, amorphous silicon, and gate dielectric are etched to form the gate lines. It should be noted that the state of silicon is amorphous at the time of etching to minimize the line edge roughness. The absence of grain boundaries, which would be present in polysilicon, reduces the line edge roughness at the time of etching. Further, the amorphous silicon is confined on the top by gate cap dielectric and on the bottom by gate dielectric. The sides of amorphous silicon are then confined by at least one spacer, which is deposited under a low temperature process. Low temperature processing in this manner preserves the chrystallographical state of the amorphous silicon material throughout the spacer deposition(s). Once the at least one spacer is in place, the amorphous silicon is exposed to a temperature sufficiently high to convert the amorphous silicon to polysilicon. By waiting until the amorphous silicon is confined within the at least one spacer before converting it to polysilicon, the movement of the silicon atoms within the silicon material is confined within the at least one spacer laterally and the variation in gate length is reduced.

Prior to the present invention, the amorphous silicon was subjected to high temperatures in an unconfined environment, with the result being that shown and described above in conjunction with FIG. 1. Specifically, under previous methods, the device was subjected to high temperature gate sidewall oxidation at a temperature of approximately 1000° C. when the amorphous silicon was in an unconfined environment (e.g., prior to implantation of any spacers). This high temperature process transformed the amorphous silicon to polysilicon. However, because it was performed in an unconfined environment, the aforementioned increased surface roughness and gate line variation were exhibited.

Figure 2:
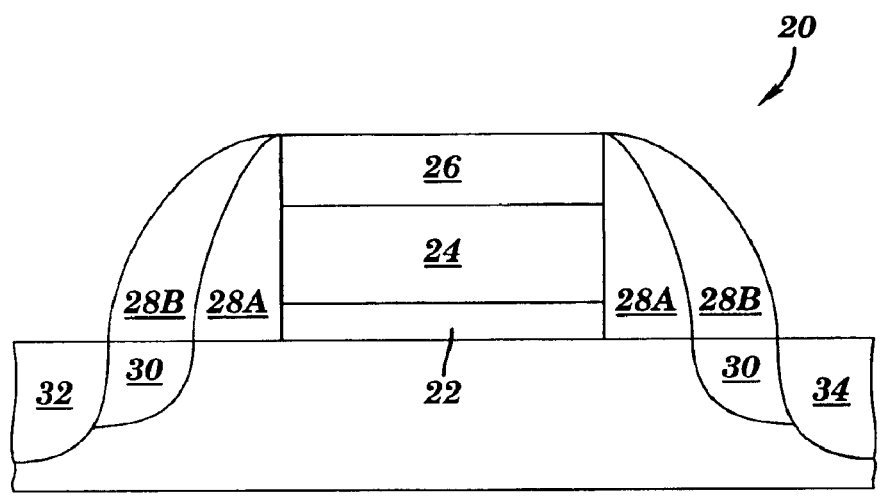
FIG. 2 depicts a FET device as produced according to the present invention.

Referring now to FIG. 2, an electronic device 20 produced according to the present invention is shown. It should be understood in advance that although FIG. 2 depicts a typical FET device produced according to the present invention, many alternatives are possible. Specifically, the teachings described herein could be used to produce any type of electronic device (e.g., MOSFET, CMOS, etc.) in which a polysilicon gate material is traditionally used. In any event, under the present invention, layer of gate dielectric 22 (e.g., a thermal oxide) is formed. On top of layer of gate dielectric 22, layer of amorphous silicon 24 is formed (e.g., deposited at 500° C. or 550° C.). Once layer of amorphous silicon 24 is in place, gate cap dielectric 26 is formed. In a typical embodiment, gate cap dielectric 26 is silicon nitride, silicon oxide or the like and can be deposited on layer of amorphous silicon 24. In any event, once gate cap dielectric 24 is in place, the device 20 is subjected to lithography and gate stack etch.

After the etching process, device 20 is subjected to a gate sidewall oxidation process at a temperature sufficiently low (e.g., at 600° C. for high pressure oxidation such as at 10ATM) so that the amorphous silicon 24 does not transform to polysilicon. In general, the gate sidewall oxidation process is carried out at a temperature lower than approximately 700° C. (e.g., 675° C.). However, in another embodiment, the gate sidewall oxidation process is carried out at a temperature lower than approximately 750° C.

In any event, after the low temperature gate sidewall oxidation process, at least one spacer 28A and 28B is deposited (e.g., via BTBAS LPCVD) adjacent the layer of amorphous silicon 24 at low temperatures (e.g., less than approximately 750° C. or 700° C. such as 675° C. or 600° C.). In a typical embodiment, a first spacer 28A is deposited at low temperature, followed by implantation of an extension 30. Subsequent to extension 30 implantation, second spacer 28B is deposited at the low temperature. Once all desired spacers 28A–B are in place, source 32 and drain 34 can be implanted. Thereafter, layer of amorphous silicon 24 is exposed to a temperature sufficiently high and for a duration of time sufficient to transform the amorphous silicon to polysilicon.

Under the present invention, layer of amorphous silicon 24 is subject to RTA at a temperature of at least approximately 750° C. to achieve the transformation. However, in other embodiments, layer of amorphous silicon 24 can be exposed to a temperature of at least approximately 800° C. after spacers 28A–B are in place to achieve the transformation. Still yet, in the illustrative examples set forth below, layer of amorphous silicon 24 was exposed to temperatures of 1000° C. for 90 seconds or 1100° C. for 60 seconds. In any event, layer of amorphous silicon 24 is not exposed to the high temperatures until spacers 28A–B are in place. This causes the transformation to occur in an enclosed or confined environment, which reduces silicon movements, surface roughness and gate length variation.

It should be understood that under the present invention, any quantity of spacers could be provided. For example, although FIG. 2 shows two spacers 28A–B, the present invention could be carried out with more or fewer spacers. It should also be understood that the description of device 20 of FIG. 2 is not intended to be an all inclusive description. Those of ordinary skill in the art will recognize that other layers/components not described and/or shown are part of device 20.

Illustrative Examples

Under experiment, twenty FET wafers were prepared under different conditions. Some of the wafers were prepared under the previous conventional techniques, while other were prepared according to the present invention. The table below shows the manner in which the twenty wafers were prepared. It should be understood in advance that wafers 2 and 14 represent wafers produced according to the present invention, while wafer 19 represents a wafer produced according to the previous conventional technique described above.

| Wafer No. | Gate Silicon Temp. | Sidewall Oxidation Process | Gate Implant | Spacer 1 Dep. | Spacer 2 Dep. | Final RTA Temp. |
|---|---|---|---|---|---|---|
| 1 | 525° C. | HIPOX | P type | BTBAS 175 | BTBAS 900 | 1000° C. |
| 2 | 525° C. | HIPOX | P type | BTBAS 175 | BTBAS 900 | 1000° C. |
| 3 | 525° C. | HIPOX | P type | BTBAS 175 | BTBAS 900 | 1000° C. |
| 4 | 525° C. | HIPOX | P type | RTCVD 175 | RTCVD 900 | 1000° C. |
| 5 | 525° C. | HIPOX | P type | BTBAS 175 | BTBAS 900 | 700° C. |
| 6 | 525° C. | HIPOX | P type | BTBAS 175 | BTBAS 900 | 1100° C. |
| 7 | 525° C. | RTA | P type | BTBAS 175 | BTBAS 900 | 700° C. |
| 8 | 525° C. | SVG 700° C. | P type | BTBAS 175 | BTBAS 900 | 1000° C. |
| 9 | 525° C. | HIPOX | N type | BTBAS 175 | BTBAS 900 | 1000° C. |
| 10 | 525° C. | HIPOX | N type | BTBAS 175 | BTBAS 900 | 1000° C. |
| 11 | 525° C. | HIPOX | N type | BTBAS 175 | BTBAS 900 | 1000° C. |
| 12 | 525° C. | HIPOX | N type | RTCVD 175 | RTCVD 900 | 1000° C. |
| 13 | 525° C. | HIPOX | N type | BTBAS 175 | BTBAS 900 | 700° C. |
| 14 | 525° C. | HIPOX | N type | BTBAS 175 | BTBAS 900 | 1100° C. |
| 15 | 525° C. | RTA | N type | BTBAS 175 | BTBAS 900 | 700° C. |
| 16 | 525° C. | SVG 700° C. | N type | BTBAS 175 | BTBAS 900 | 1000° C. |
| 17 | 550° C. | HIPOX | P type | BTBAS 175 | BTBAS 900 | 1000° C. |
| 18 | 550° C. | HIPOX | N type | BTBAS 175 | BTBAS 900 | 1000° C. |
| 19 | 620° C. | RTA | P type | RTCVD 175 | RTCVD 900 | 700° C. |
| 20 | 620° C. | RTA | N type | RTCVD 177 | RTCVD 900 | 700° C. |

Under the table above, the amorphous silicon deposition temperature was either 525° C. or 550° C., whereas the polysilicon deposition temperature was 620° C. The sidewall oxidation temperature was 600° C. for the high pressure oxidation (e.g., 10ATM) process (HIPOX), and 700° C. for the SVG 700° C. process. The RTA sidewall oxidation temperature was 1000° C. for 90 seconds. Further spacer 1 was 17.5 nm thick and was deposited at a temperature of 575° C. for the BTBAS 175 process and 720° C. for the RTCVD 175 process. Spacer 2 was 90 nm thick and was deposited at a temperature of 600° C. for the BTAS 900 process and 720° C. for the RTCVD 900 process.

Figure 3:
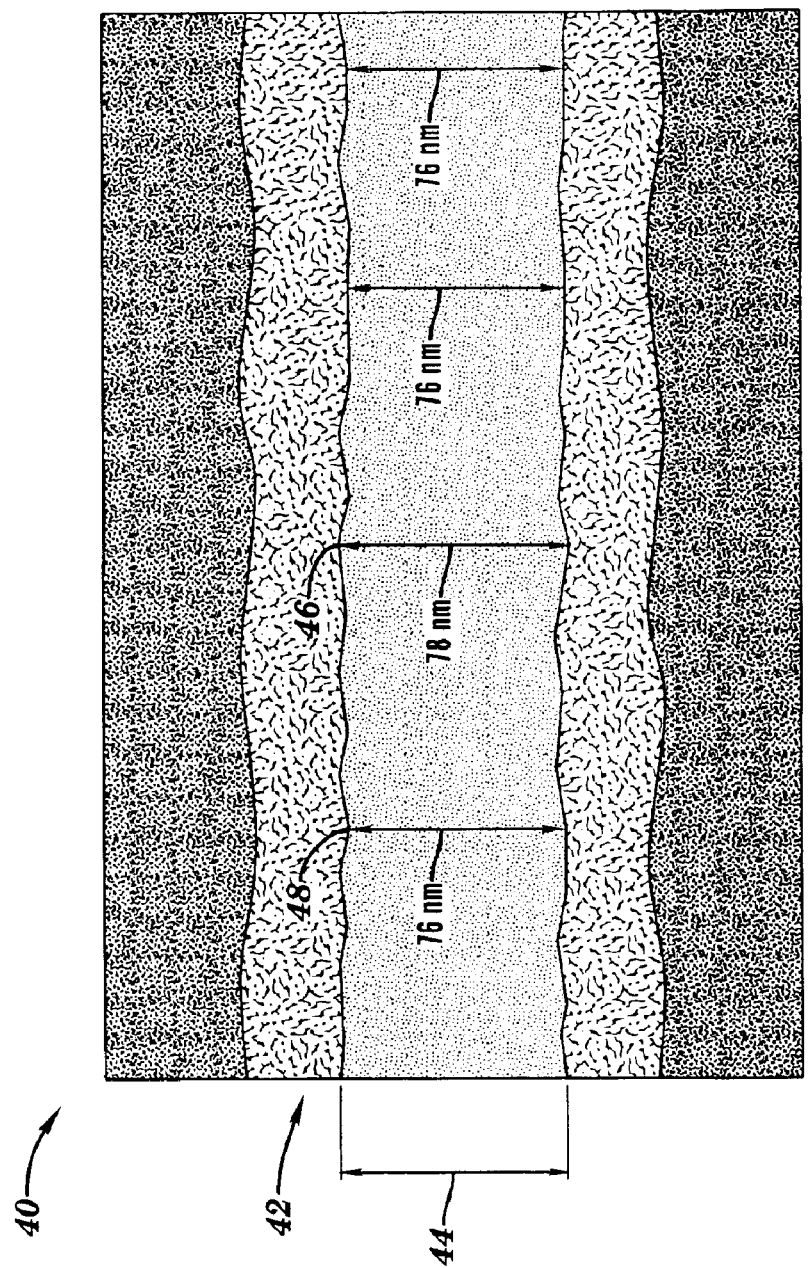
FIG. 3 depicts an illustration of an SEM image of a polysilicon gate line as produced according to the present invention.

With the new scheme, the reduction in line roughness was readily apparent. The total range of the gate length decreased from 17 nm for the conventional polysilicon gate process, to 8 nm for the amorphous silicon gate with 1000° C. RTA for 90 seconds, to 5 nm for the amorphous silicon gate with 1100° C. RTA for 60 seconds. FIG. 3 depicts a SEM image 40 of a polysilicon gate line 42 formed subsequent to RTA of the layer of amorphous silicon at a temperature of 1000° C. for 90 seconds. As shown, the surface of polysilicon gate line 42 of the polysilicon is significantly less rough than surface of polysilicon gate line 12 shown in FIG. 1. To this extent, gate length 44 variation is also reduced. For example, at point 46 gate length 44 is approximately 78 nm. Conversely, at point 48, gate length 44 is approximately 76 nm.

Figure 4:
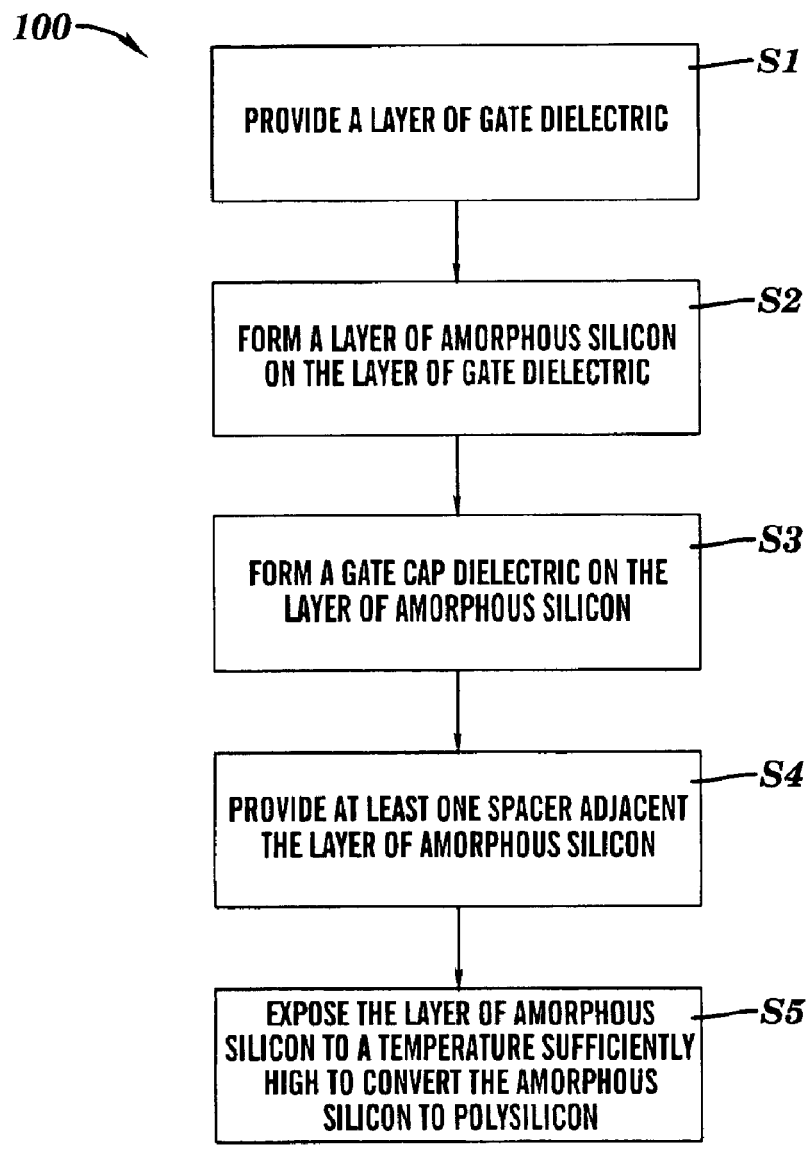
FIG. 4 depicts a method flow diagram according to the present invention.

Referring not to FIG. 4, a method flow diagram 100 according to the present invention is shown. As depicted, first step S1 of method 100 is to providing a layer of gate dielectric. Second step S2 is to forming a layer of amorphous silicon on the layer of gate dielectric. Third step S3 is to forming a gate cap dielectric on the layer of amorphous silicon. Fourth step S4 is to provide at least one spacer adjacent the layer of amorphous silicon. As indicated above, all processing of the device before the deposition of the spacers is complete is done at a temperature sufficiently low so as to not result in transformation of the amorphous silicon to polysilicon. Once the at least one spacer is provided, the amorphous silicon is exposed to a temperature sufficiently high to convert the amorphous silicon to polysilicon in step S5. As indicated above, this temperature is at least approximately 750° C. or 800° C. In the illustrative examples shown above, the temperatures used to transform the amorphous silicon to polysilicon were 1000° C. and 1100° C.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

We claim:

1. A method for forming an electronic device, comprising:
   providing a layer of gate dielectric;
   forming a layer of amorphous silicon on the layer of gate dielectric;
   forming a gate cap dielectric on the layer of amorphous silicon;
   providing at least one spacer adjacent the layer of amorphous silicon; and
   exposing the amorphous silicon to a temperature sufficiently high to convert the amorphous silicon to polysilicon after the at least one spacer has been provided.

2. The method of claim 1, wherein the exposing step comprises exposing the amorphous silicon to a temperature of at least approximately 750° C. to convert the amorphous silicon to polysilicon after the at least one spacer has been provided.

3. The method of claim 1, wherein the exposing step comprises exposing the amorphous silicon to a temperature of at least approximately 800° C. to convert the amorphous silicon to polysilicon after the at least one spacer has been provided.

4. The method of claim 1, wherein the exposing step comprises performing a rapid thermal anneal at a temperature sufficiently high to convert the amorphous silicon to polysilicon after the at least one spacer has been provided.

5. The method of claim 1, further comprising performing a gate sidewall oxidation at a temperature sufficiently low to avoid transformation of the amorphous silicon to polysilicon before providing the at least one spacer.

6. The method of claim 1, wherein the at least one spacer is provided at a temperature of less than approximately 750° C.

7. The method of claim 1, further comprising:
   performing lithography and etching after the gate cap dielectric has been formed; and
   implanting a source and a drain into the electronic device after the at least one spacer has been provided.

8. The method of claim 1, wherein the gate cap dielectric is selected from the group consisting of silicon nitride and silicon dioxide.

9. The method of claim 1, wherein the electronic device is a field-effect transistor (FET) device.

10. A method for forming an electronic device, comprising:
   providing a layer of gate dielectric;
   forming a layer of amorphous silicon on the layer of gate dielectric;
   forming a gate cap dielectric on the layer of amorphous silicon;
   providing at least one spacer adjacent the layer of amorphous silicon; and
   performing a rapid thermal anneal at a temperature of at least approximately 750° C. after the at least one spacer has been provided to convert the amorphous silicon to polysilicon.

11. The method of claim 10, wherein the exposing step comprises performing a rapid thermal anneal at a temperature of at least approximately 750° C. to convert the amorphous silicon to polysilicon after the at least one spacer has been provided.

12. The method of claim 10, further comprising performing a gate sidewall oxidation at a temperature below approximately 750° C. to avoid transformation of the amorphous silicon to polysilicon before providing the at least one spacer.

13. The method of claim 10, further comprising:
   performing lithography and etching after the gate cap dielectric has been formed and
   implanting a source and a drain into the electronic device after the at least one spacer has been provided.

14. The method of claim 10, wherein the gate cap dielectric is selected from the group consisting of silicon nitride and silicon dioxide.

15. The method of claim 10, wherein the electronic device is a field-effect transistor (FET) device.

16. A method for forming a field-effect transistor (FET) device, comprising:
   providing a layer of gate dielectric;
   forming a layer of amorphous silicon on the layer of gate dielectric;
   forming a gate cap dielectric on the layer of amorphous silicon;
   providing a first spacer adjacent the layer of amorphous silicon;
   providing a second spacer adjacent the layer of amorphous silicon; and
   exposing the amorphous silicon to a temperature of at least approximately 750° C. after the second spacer has been provided to convert the amorphous silicon to polysilicon.

17. The method of claim 16, wherein the exposing step comprises performing a rapid thermal anneal at a temperature of at least approximately 750° C. to convert the amorphous silicon to polysilicon after the at least one spacer has been provided.

18. The method of claim 16, further comprising performing a gate sidewall oxidation at a temperature below approximately 750° C. to avoid transformation of the amorphous silicon to polysilicon before providing the at least one spacer.

19. The method of claim 16, further comprising:
   performing lithography and etching after the gate cap dielectric has been formed;
   implanting an extension into the FET device after the first spacer has been provided; and
   implanting a source and a drain into the FET device after the second spacer has been provided.

20. The method of claim 16, wherein the gate cap dielectric is selected from the group consisting of silicon nitride and silicon dioxide.

* * * * *